United States Patent
Chou et al.

(10) Patent No.: US 7,626,278 B2
(45) Date of Patent: Dec. 1, 2009

(54) CHIP PACKAGE

(75) Inventors: Chien-Chen Chou, Kaohsiung (TW); Hung-Hsiang Lu, Kaohsiung (TW); Chi-Feng Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 342 days.

(21) Appl. No.: 11/642,892

(22) Filed: Dec. 21, 2006

(65) Prior Publication Data

US 2007/0241466 A1    Oct. 18, 2007

(30) Foreign Application Priority Data

Apr. 12, 2006    (TW) .............................. 95112965 A

(51) Int. Cl.
*H01L 23/544*    (2006.01)
(52) U.S. Cl. ............... 257/797; 438/401; 257/E23.001; 257/E23.179; 257/E21.525
(58) Field of Classification Search ................ 257/778, 257/787, 797, E23.001, E23.179, E21.525; 438/11, 15, 108, 401, 462, 975
See application file for complete search history.

(56) References Cited

U.S. PATENT DOCUMENTS

| | | | | |
|---|---|---|---|---|
| 5,256,578 A | * | 10/1993 | Corley et al. | 438/17 |
| 6,468,813 B1 | * | 10/2002 | Chao et al. | 438/7 |
| 2006/0128040 A1 | * | 6/2006 | Chen et al. | 438/15 |

* cited by examiner

*Primary Examiner*—Quoc D Hoang
(74) *Attorney, Agent, or Firm*—Rabin & Berdo, P.C.

(57) ABSTRACT

A chip package including a substrate, a chip and a mark is provided. The substrate has a carrying surface. A mark region is disposed on the carrying surface. The chip is disposed on the carrying surface and electrically connected to the substrate. The mark is disposed in the mark region for recording a process parameter.

7 Claims, 3 Drawing Sheets

A-A'

CHIP PACKAGE

This application claims the benefit of Taiwan application Serial No. 95112965, filed Apr. 12, 2006, the subject matter of which is incorporated herein by reference.

BACKGROUND OF THE INVENTION

1. Field of the Invention

The invention relates in general to a semiconductor device and a manufacturing process thereof, and more particularly to a chip package and a manufacturing process thereof.

2. Description of the Related Art

In the semiconductor industry, manufacture of integrated circuits (IC) includes three stages: design of integrated circuits, production of integrated circuits and package of integrated circuits. When an integrated circuit is packaged, a bare chip is manufactured through wafer production, circuit design, mask production and wafer cutting. Each bare chip formed by cutting a wafer is electrically connected to a substrate through several wires. Then, encapsulant encapsulates the bare chip to form a chip package. The step of encapsulating the bare chip by the encapsulant is used for protecting the bare chip from moisture and particle pollution.

After a molding process is preformed, an electrical test or other tests are performed on the chip package to ensure a good yield rate of the chip package production. However, only a serial number of the encapsulating machine is marked on the encapsulant in the chip package. When the test result shows that the chip package does not function normally due to broken wires or other reasons, the machine causing the problem can not be traced down. As a result, the machine that does not function normally can not be fixed. The yield rate of the chip package production is decreased.

SUMMARY OF THE INVENTION

The invention is also directed to a chip package including a process parameter of the manufacturing process of the chip package, so that a user can understand the manufacture of the chip package.

According to the present invention, a chip package including a substrate, a chip and a mark is provided. The substrate has a carrying surface. A mark region is disposed on the carrying surface. The chip is disposed on the carrying surface and electrically connected to the substrate. The mark is disposed in the mark region for recording a process parameter.

In an embodiment of the invention, the chip package further includes several wires electrically connecting the chip and the substrate.

In an embodiment of the invention, the chip package further includes an encapsulant disposed on the substrate and the chip. The encapsulant encapsulates the wires, the mark region and the mark.

In an embodiment of the invention, the substrate further includes a metal surface layer and a solder mask layer. The metal surface layer includes several contacts and several mark pads. The solder mask layer is disposed on the metal surface layer and exposes the contacts and the mark pads. The exposed mark pads form the mark region.

In an embodiment of the invention, the mark comprises several metal bumps disposed on the mark pads.

In an embodiment of the invention, the mark is binary code or decimal code.

In an embodiment of the invention, the process parameter is a serial number of a machine for example.

In an embodiment of the invention, the package substrate includes several contacts and several mark pads. The mark pads and the contacts are formed at the same time to form the mark region.

In an embodiment of the invention, the chip is disposed on the substrate by a wire-bonding process performed by a wire-bonding machine.

In an embodiment of the invention, the above wire-bonding machine forms several metal bumps on the mark pads to form the mark.

In an embodiment of the invention, an encapsulant is formed on the substrate and the chip after the mark is formed in the mark region. The encapsulant encapsulates the contacts, the mark region and the mark.

In an embodiment of the invention, the process parameter is a serial number of the wire-bonding machine for example.

In an embodiment of the invention, the mark is binary code or decimal code to record the process parameter.

A mark region is disposed on the carrying surface of the substrate in the chip package, so that a user can know the related information through the process parameter in the mark region. As a result, the chip package is ensured to function normally after processed. The yield rate of the chip package production is increased.

The invention will become apparent from the following detailed description of the preferred but non-limiting embodiments. The following description is made with reference to the accompanying drawings.

DETAILED DESCRIPTION OF THE INVENTION

Figure 1A:
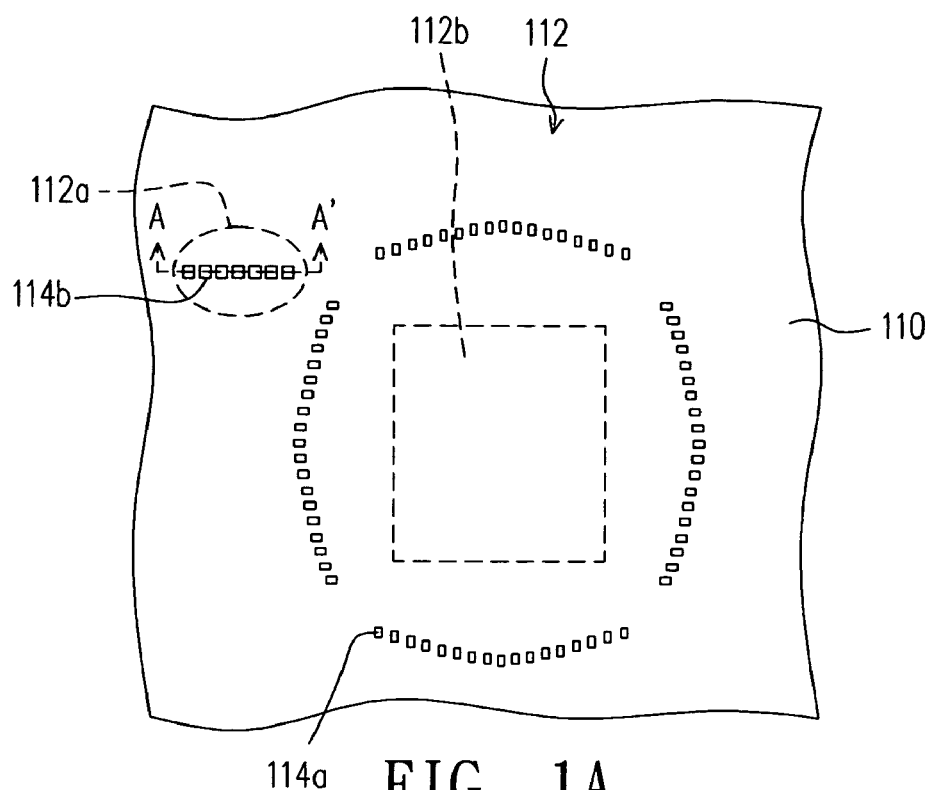
FIGS. 1A-1D show a flow chart of a manufacturing process of a chip package according to a preferred embodiment of the invention.

FIGS. 1A~1D show a flow chart of a manufacturing process of a chip package according to a preferred embodiment of the invention. First, as shown in FIG. 1A, a substrate 110 having a carrying surface 112 is provided. A mark region 112a is disposed on the carrying surface 112. The mark region 112a is illustrated as follow.

Figure 2:
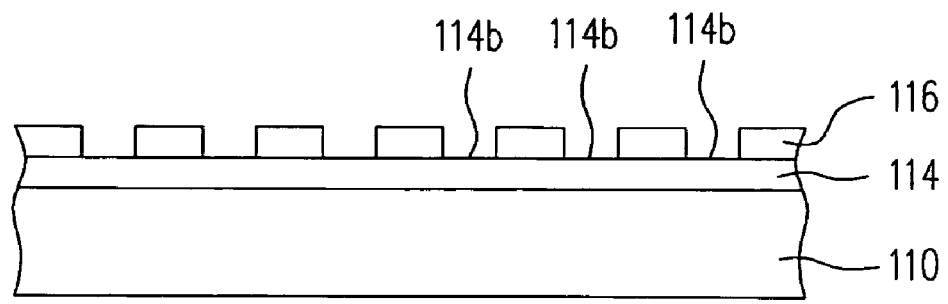
FIG. 2 is an enlarged view of the substrate along a cross-sectional line A-A' in FIG. 1A.

FIG. 2 is an enlarged view of the substrate along a cross-sectional line A-A' in FIG. 1A. Please referring to FIG. 1A and FIG. 2 at the same time, the substrate 110 includes a metal surface layer 114 and a solder mask layer 116 in the present embodiment for example. The metal surface layer 114 includes several contacts 114a and several mark pads 114b. The solder mask layer 116 is disposed on the metal surface layer 114 for example and exposes the contacts 114a and the mark pads 114b. In the present embodiment, the mark pads 114b and the contacts 114a are preferably formed at the same time. The mark region 112a is formed by the mark pads 114b exposed by the solder mask layer 116. Therefore, the mark region 112a of the present embodiment records process data according to the user's need.

Figure 1B:
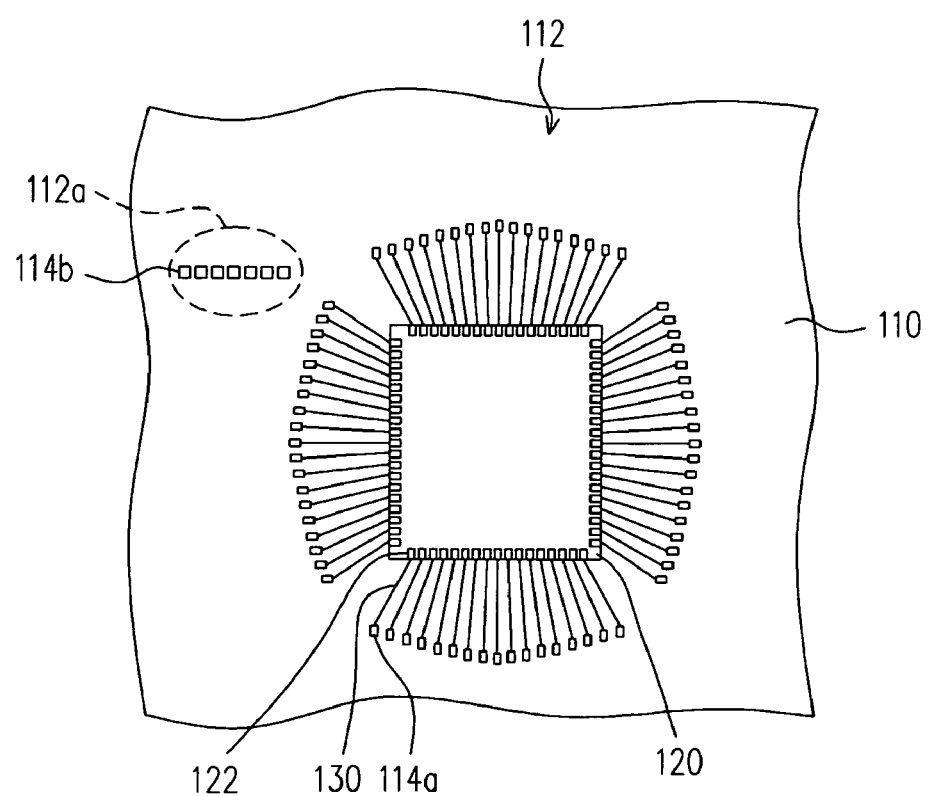

After the substrate 110 is provided, a chip 120 is disposed in a chip carrying region 112b (please referring to FIG. 1A) of the carrying surface 112. The chip 120 is electrically connected to the substrate 110 (as shown in FIG. 1B). The chip 120 includes several bond pads 122 for example. The chip 120 is disposed on the substrate 110 preferably through a wire bonding process performed by a wire-bonding machine (not shown in drawings). As a result, the bond pads 122 on the chip 120 are electrically connected to the contacts 114a of the substrate 110 through several wires 130.

Figure 1C:
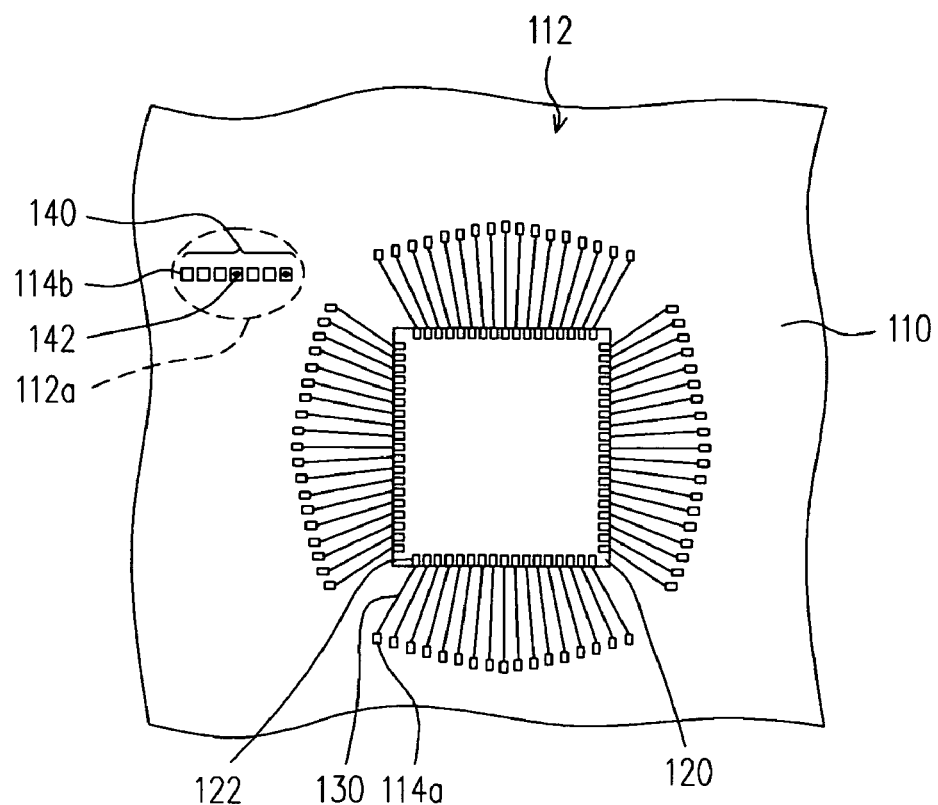

Afterwards, as shown in FIG. 1C, a mark 140 is formed in the mark region 112a for recording a process parameter. For example, the process parameter is a serial number of a machine. In the present embodiment, the mark 140 is binary to record the process parameter. In other words, the mark 140 is a binary code. Therefore, the user can record the related process parameter in the mark region 112a manually or automatically. In the present embodiment, the wire-bonding machine forms several metal bumps 142 on the mark pads 114b to form the mark 140 for example. The process parameter is preferably the serial number of the wire-bonding machine. However, the above-described method for forming the mark 140 is only an example. The invention is not limited thereto.

Figure 1D:
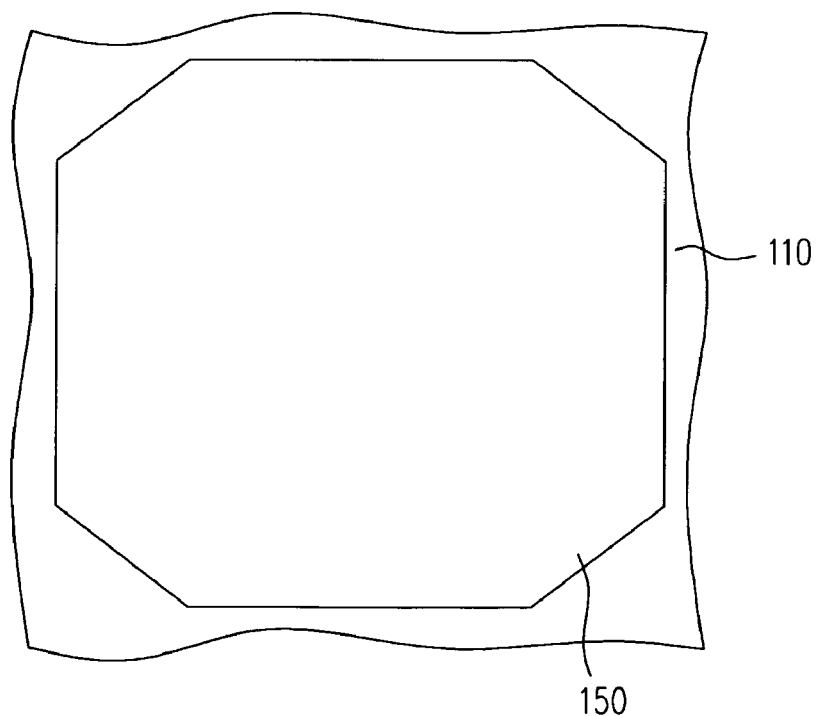

After the mark 140 is formed in the mark region 112a, an encapsulant 150 is formed on the substrate 110 and the chip 120 (as shown in FIG. 1D) for example. The encapsulant 150 preferably encapsulates the contacts 114a, the mark region 112a and the mark 140 (as shown in FIG. 1C). Accordingly, the chip package of the invention is accomplished.

Moreover, the substrate in FIG. 1A is not the only embodiment of the invention. Another embodiment of the invention is illustrated as follow. The same components use the same reference numbers for clarity.

Figure 3:
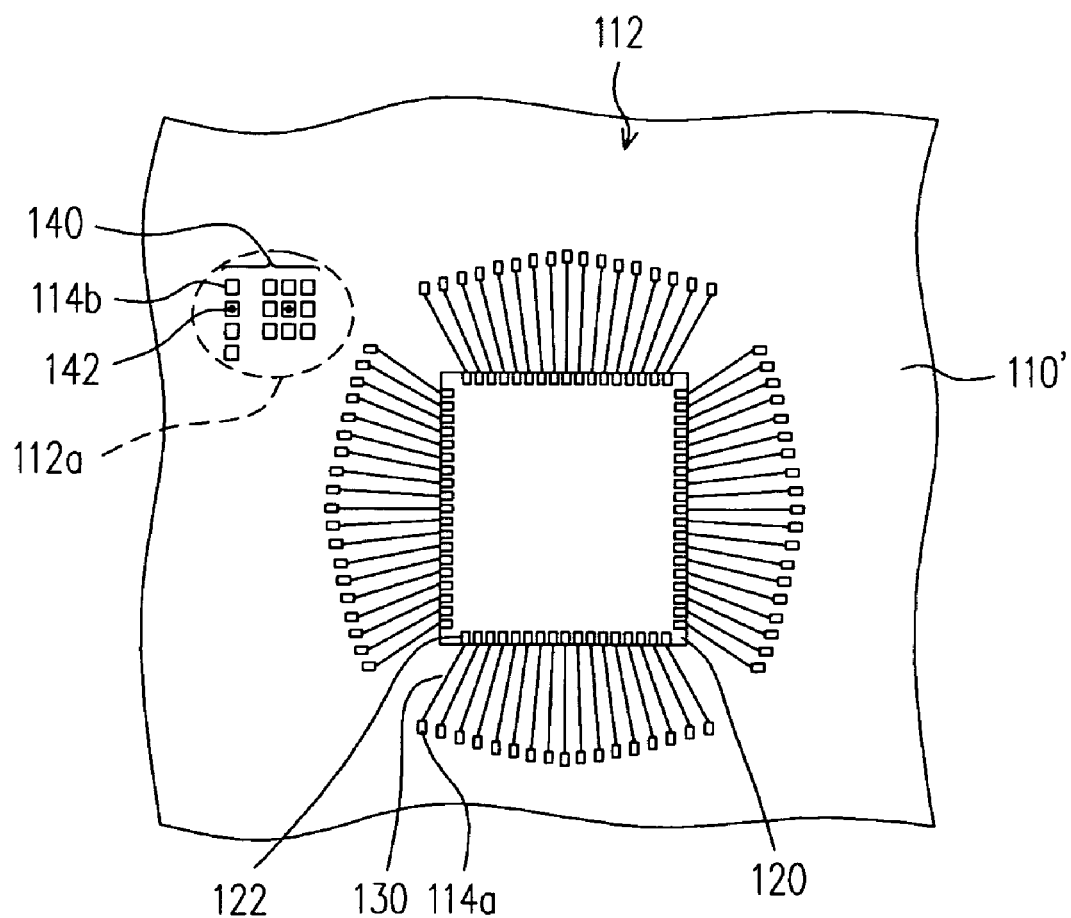
FIG. 3 illustrates another substrate according to a preferred embodiment of the invention.

Please referring to FIG. 3, another substrate according to a preferred embodiment of the invention is illustrated in FIG. 3. In the present embodiment, the mark region 112a on the substrate 110' is decimal to record the process parameter. In other words, the mark 140 is a decimal code mark. The same as the above manufacturing process, the wire-bonding machine forms several metal bumps 142 on the mark pads 114b to form the mark 140 in the present embodiment.

What is worth mentioning is that after the chip is disposed on the carrying surface of the substrate, the mark is formed in the mark region to record the process parameter in the present invention. Therefore, when the test result shows that the chip package does not function normally, the user can trace the machine that processes the defective chip package. Then, the user can check if the machine functions normally. As a result, the chip package is ensured to function well, and the yield rate of the chip package production is increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip package comprising:
   a substrate with a carrying surface, comprising:
   a metal surface layer having a plurality of mark pads; and
   a solder mask layer disposed on the metal surface layer and having a plurality of first openings, wherein the marks pads are exposed through the first openings to form a mark region on the carrying surface;
   a chip disposed on the carrying surface and electrically connected to the substrate; and
   a plurality of metal bumps disposed on the mark pads according to a process parameter so as to form a mark for recording a process parameter.

2. The chip package according to claim 1, further comprising a plurality of wires electrically connected the chip and the substrate.

3. The chip package according to claim 2, further comprising an encapsulant disposed on the substrate and the chip, wherein the encapsulant encapsulates the wires, the mark region and the mark.

4. The chip package according to claim 1, wherein the metal surface layer further has a plurality of contacts, and the solder mask layer further has a plurality of second openings for exposing the contacts.

5. The chip package according to claim 1, wherein the mark is a binary code or a decimal code.

6. The chip package according to claim 1, wherein the process parameter comprises a serial number of a machine.

7. The chip package according to claim 1, wherein the mark pads selectively have the metal bumps disposed thereon according to the process parameter.

* * * * *